(12) United States Patent
Tehrani et al.

(10) Patent No.: US 12,410,519 B2
(45) Date of Patent: Sep. 9, 2025

(54) AUTOMATED SHOWERHEAD TILT ADJUSTMENT

(71) Applicant: Lam Research Corporation, Fremont, CA (US)

(72) Inventors: Sam Jafarian Tehrani, King City, OR (US); Bryan Anthony Cmelak, Tigard, OR (US); Jacob Lee Hiester, Newberg, OR (US); Bin Luo, Beaverton, OR (US); John Wiltse, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/012,224

(22) PCT Filed: Jun. 10, 2021

(86) PCT No.: PCT/US2021/036808
§ 371 (c)(1),
(2) Date: Dec. 21, 2022

(87) PCT Pub. No.: WO2021/262446
PCT Pub. Date: Dec. 30, 2021

(65) Prior Publication Data
US 2023/0272533 A1    Aug. 31, 2023

Related U.S. Application Data

(60) Provisional application No. 63/042,980, filed on Jun. 23, 2020.

(51) Int. Cl.
*C23C 16/52*    (2006.01)
*C23C 16/455*   (2006.01)

(52) U.S. Cl.
CPC ............ *C23C 16/45587* (2013.01); *C23C 16/45565* (2013.01); *C23C 16/52* (2013.01)

(58) Field of Classification Search
CPC ........ C23C 16/45587; C23C 16/45565; C23C 16/52; C23C 16/463; C23C 16/45542; C23C 16/50; H01L 21/0228
See application file for complete search history.

(56) References Cited

U.S. PATENT DOCUMENTS

| 8,556,156 B1 * | 10/2013 | Bharadwaj ......... B23K 20/1235 |
|---|---|---|
| | | 228/2.1 |
| 2013/0206594 A1 * | 8/2013 | Collins ................ H01J 37/3211 |
| | | 204/298.34 |
| 2018/0096874 A1 | 4/2018 | Schaller et al. |

(Continued)

FOREIGN PATENT DOCUMENTS

| CN | 111211031 A | 5/2020 |
|---|---|---|
| CN | 115720597 | 2/2023 |

(Continued)

OTHER PUBLICATIONS

"International Application Serial No. PCT US2021 036808, International Preliminary Report on Patentability mailed Jan. 5, 2023", 8 pgs.

(Continued)

*Primary Examiner* — Hai Y Zhang
(74) *Attorney, Agent, or Firm* — Schwegman Lundberg & Woessner, P.A.

(57) ABSTRACT

In some examples, an automated tilting system is provided for adjusting an orientation of a component in a substrate processing chamber. The automated tilting system comprises at least one tilt adjustment motor arranged to cooperate with the component and be connected to a portion of the component by a coupling. The coupling is configured such that automated rotational motion by the at least one tilt adjustment motor imparts corresponding axial movement, (Continued)

relative to the at least one tilt adjustment motor or a datum structure, to the connected portion of the component to adjust the orientation of the component in the processing chamber.

8 Claims, 5 Drawing Sheets

(56) References Cited

U.S. PATENT DOCUMENTS

| | | | |
|---|---|---|---|
| 2019/0032214 A1 | | 1/2019 | Luo et al. |
| 2019/0153601 A1* | | 5/2019 | Luo .......................... C23C 16/50 |

FOREIGN PATENT DOCUMENTS

| | | | |
|---|---|---|---|
| JP | 2011204784 A | | 10/2011 |
| JP | 2013211580 A | | 10/2013 |
| JP | 2017199898 A | | 11/2017 |
| JP | 2023532425 | | 7/2023 |
| TW | 201921466 | | 6/2019 |
| WO | WO-2009085708 A1 | | 7/2009 |
| WO | WO-2021262446 A1 | | 12/2021 |

OTHER PUBLICATIONS

Japanese Application Serial No. 2022-577464, Voluntary Amendment filed May 13, 2024, w/ English claims, 11 pgs.
Korean Application Serial No. 10-2023-7002255, Voluntary Amendment filed Jun. 4, 2024, w/ English Claims, 3 pgs.
International Application Serial No. PCT/US2021/036808, International Search Report mailed Sep. 27, 2021, 3 pgs.
International Application Serial No. PCT/US2021/036808, Written Opinion mailed Sep. 27, 2021, 16 pgs.
Japanese Application Serial No. 2022-577464, Notification of Reasons for Refusal mailed Dec. 24, 2024, w/ English translation, 10 pgs.
"Japanese Application Serial No. 2022-577464, Response filed Mar. 24, 2025 to Notification of Reasons for Refusal mailed Dec. 24, 2024", W English Claims, 14 pgs.
"Taiwanese Application Serial No. 110122683, Office Action mailed Apr. 15, 2025", With Machine English translation 41 pgs.
"Japanese Application Serial No. 2025-77686, Voluntary Amendment filed Jun. 4, 2025", w English claims, 12 pgs.
"Taiwanese Application Serial No. 110122683, Response filed Jul. 17, 2025 to Office Action mailed Apr. 15, 2025", 20 pgs.

* cited by examiner

AUTOMATED SHOWERHEAD TILT ADJUSTMENT

CLAIM OF PRIORITY

This application is a U.S. National Stage Filing under 35 U.S.C. 371 from International Application No. PCT/US2021/036808, filed on Jun. 10, 2021, and published as WO 2021/262446 A1 on Dec. 30, 2021, which claims the benefit of priority to U.S. Provisional Patent Application Ser. No. 63/042,980, filed on Jun. 23, 2020, each of which is incorporated by reference herein in its entirety.

FIELD

The present disclosure relates generally to systems, apparatus, and methods for automated tilt adjustment of a showerhead component in substrate processing systems.

BACKGROUND

A conventional showerhead and cooling plate assembly in a substrate processing system typically includes a series of threaded rods or screws that can be adjusted manually to tilt the showerhead cooling plate into a desired orientation. A particular orientation may be desired after planned maintenance or during a showerhead replacement, for example. The orientation operation typically involves a manual gap check of a substrate-support assembly each time an initial adjustment in orientation is made, followed by some form of metrology to verify a "fine tuning" of the tilting operation until the desired orientation is met. This manual adjustment usually requires an appropriately qualified expert to be physically present on site and typically involves several hours of cooling down and heating up of the showerhead components. Tool operators cannot change tilt orientations quickly, yet imperfect or rushed tilting can lead to undesired wafer scrap. Moreover, cooling plate components are often of brazed form and the extra complexity and inspection of these components can add manufacturing time and cost.

The background description provided herein is to generally present the context of the disclosure. It should be noted that the information described in this section is presented to provide the skilled artisan some context for the following disclosed subject matter and should not be considered as admitted prior art. More specifically, work of the presently named inventors, to the extent it is described in this background section, as well as aspects of the description that may not otherwise qualify as prior art at the time of filing, are neither expressly nor impliedly admitted as prior art against the present disclosure.

SUMMARY

The present disclosure relates generally to systems, apparatus, and methods for automated tilt adjustment of a showerhead component in substrate processing systems.

In some examples, an automated tilting system for adjusting an orientation of a component in a substrate processing chamber is provided. An example automated tilting system comprises at least one tilt adjustment motor arranged to cooperate with the component; the at least one tilt adjustment motor connected directly or indirectly to a connected portion of the component by a coupling, the coupling configured such that automated rotational motion by the at least one tilt adjustment motor imparts corresponding axial movement, relative to the at least one tilt adjustment motor or a datum structure, to the connected portion of the component thereby to adjust the orientation of the component in the processing chamber.

In some examples, the component is a showerhead component or a cooling plate component. In some examples, the coupling includes an axial plunge coupler-screw interface. In some examples, the axial plunge coupler-screw interface decouples axial load from an associated tilt adjustment motor. In some examples, the axial plunge coupler-screw interface includes a ball-end screw received in a spherical cup. In some examples, the automated tilting system further comprises a bellows interposed between the component and the processing chamber. In some examples, the bellows at least partially provides a vacuum seal between the component and the processing chamber. In some examples, the automated tilting system further comprises one or more load compensators. In some examples, the component is, or includes, a friction stir welded component.

In some examples, a substrate processing system comprises an automated tilting system for adjusting an orientation of a component in a substrate processing chamber, the automated tilting system comprising: at least one tilt adjustment motor arranged to cooperate with the component; the at least one tilt adjustment motor connected directly or indirectly to a connected portion of the component by a coupling, the coupling configured such that automated rotational motion by the at least one tilt adjustment motor imparts corresponding axial movement, relative to the at least one tilt adjustment motor or a datum structure, to the connected portion of the component thereby to adjust the orientation of the component in the processing chamber. In some examples, the automated tilt adjustment system of the substrate processing system includes any one or more of the elements summarized above.

In some examples, a non-transitory computer-readable storage medium is provided. An example computer-readable storage medium includes instructions which, when executed by a controller, cause the controller to communicate with at least one tilt adjustment motor arranged to cooperate with a component in a substrate processing chamber, wherein the at least one tilt adjustment motor is connected directly or indirectly to a connected portion of the component by a coupling, the coupling configured such that automated rotational motion of the at least one tilt adjustment motor imparts corresponding axial movement, relative to the at least one tilt adjustment motor or a datum structure, to the connected portion of the component: and selectively engage the at least one tilt adjustment motor to adjust an orientation of the component.

BRIEF DESCRIPTION OF THE SEVERAL VIEWS OF THE DRAWINGS

Some embodiments are illustrated by way of example and not limitation in the views of the accompanying drawings.

DETAILED DESCRIPTION

Figure 1:
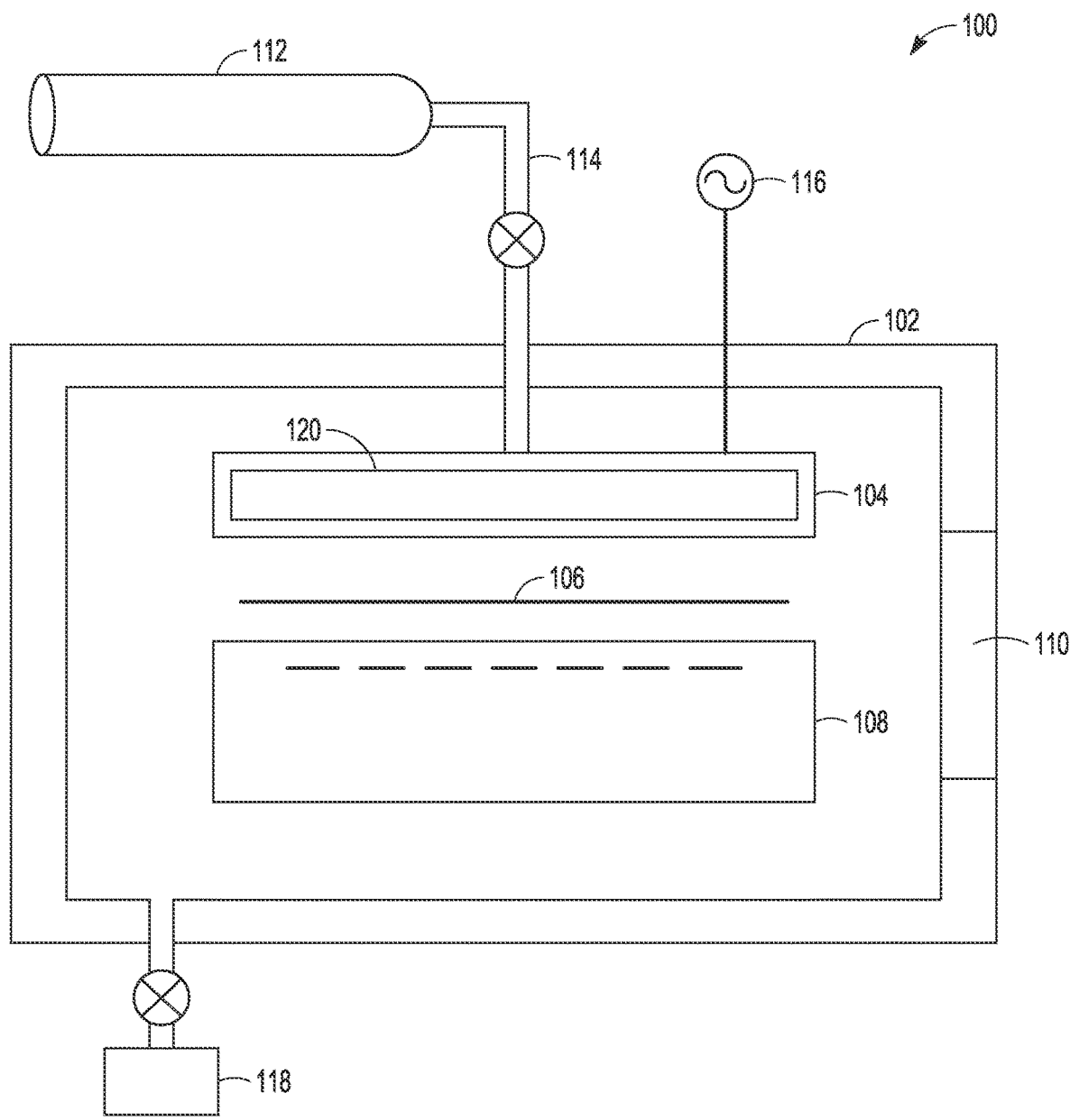
FIG. 1 is a diagram showing an example arrangement of a processing chamber within which some examples of the present disclosure may be employed, according to some example embodiments.

The description that follows includes systems, arrangements, methods, techniques, and computing machine program products that embody illustrative embodiments of the present disclosure. In the following description, for purposes of explanation, numerous specific details are set forth in order to provide a thorough understanding of example embodiments. It will be evident, however, to one skilled in the art that the present disclosure may be practiced without these specific details.

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings that form a part of this document: Copyright Lam Research Corporation, 2020, All Rights Reserved.

With reference now to FIG. 1, an example arrangement 100 of a plasma-based processing chamber is shown. The present subject matter may be used in a variety of semiconductor manufacturing and wafer processing operations, but in the illustrated example, the plasma-based processing chamber is described in the context of plasma-enhanced or radical-enhanced Chemical Vapor Deposition (CVD) or Atomic Layer Deposition (ALD) operations. The skilled artisan will also recognize that other types of ALD processing techniques are known (e.g., thermal-based ALD operations) and may incorporate a non-plasma-based processing chamber. An ALD tool is a specialized type of CVD processing system in which ALD reactions occur between two or more chemical species. The two or more chemical species are referred to as precursor gases and are used to form a thin film deposition of a material on a substrate, such as a silicon wafer as used in the semiconductor industry. The precursor gases are sequentially introduced into an ALD processing chamber and react with a surface of the substrate to form a deposition layer. Generally, the substrate repeatedly interacts with the precursors to deposit an increasingly thick layer of one or more material films on the substrate. In certain applications, multiple precursor gases may be used to form various types of film or films during a substrate manufacturing process. The gases may be extremely chemically or corrosively aggressive.

FIG. 1 is shown to include a plasma-based processing chamber 102 in which a showerhead 104 and a substrate-support assembly 108 or pedestal are disposed. The showerhead 104 may include a component such as a. showerhead electrode, or a chandelier showerhead, for example. The showerhead 104 may include a component such as cooling plate 120 described further below. Other showerhead components are possible. Some examples include systems, apparatus, and methods for automated tilt adjustment of a showerhead component in substrate processing systems, and more particularly to automated fine tuning of such components.

Typically, the substrate-support assembly 108 seeks to provide a substantially-isothermal surface and may serve as both a heating element and a heat sink for a substrate 106.

The substrate-support assembly 108 may comprise an Electrostatic Chuck (ESC) in which heating elements are included to aid in processing the substrate 106, as described above. The substrate 106 may include a wafer comprising, for example, elemental-semiconductor materials (e.g., silicon (Si) or germanium (Ge)) or compound-semiconductor materials (e.g., silicon germanium (Site)) or gallium arsenide (GaAs)). Additionally, other substrates include, for example, dielectric materials such as quartz, sapphire, semi-crystalline polymers, or other non-metallic and non-semiconductor materials.

In operation, the substrate 106 is loaded through a loading port 110 onto the substrate-support assembly 108. A gas line 114 can supply one or more process gases (e.g., precursor gases) to the showerhead 104. In turn, the showerhead 104 delivers the one or more process gases into the processing chamber 102. A gas source 112 (e.g., one or more precursor gas ampules) to supply the one or more process gases is coupled to the gas line 114. In some examples, an RF (radio frequency) power source 116 is coupled to the showerhead 104. In other examples, a power source is coupled to the substrate-support assembly 108 or ESC.

Prior to entry into the showerhead 104 and downstream of the gas line 114, a point-f-use (POU) and manifold combination (not shown) controls entry of the one or more process gases into the processing chamber 102. In the case of a processing chamber 102 used to deposit thin films in a plasma-enhanced ALD operation, precursor gases may be mixed in the showerhead 104.

In operation, the processing chamber 102 is evacuated by a vacuum pump 118. RF power is capacitively coupled between the showerhead 104 and a lower electrode (not shown explicitly) contained within or on the substrate-support assembly 108. RF power may be inductively or transformer coupled in some examples. The substrate-support assembly 108 is typically supplied with two or more RF frequencies. For example, in various embodiments, the RF frequencies may be selected from at least one frequency at about 1 MHz, 2 MHz, 13.56 MHz, 27 MHz, 60 MHz, and other frequencies as desired. A coil designed to block or partially block a particular RF frequency can be designed as needed. Therefore, particular frequencies discussed herein are provided merely for ease in understanding. The RF power is used to energize the one or more process gases into a plasma in the space between the substrate 106 and the showerhead 104. The plasma can assist in depositing various layers (not shown) on the substrate 106. In other applications, the plasma can be used to etch device features into the various layers on the substrate 106. RF power is coupled through at least the substrate-support assembly 108. The substrate-support assembly 108 may have heaters (not shown in FIG. 1) incorporated therein. The detailed design of the processing chamber 102 may vary.

In some examples, friction stir welding (FSW) is used to manufacture or join pedestal or showerhead parts such as a faceplate, a cooling plate, and a pedestal stein. The manufacture or joining of other components is possible. The methods and articles of manufacture described herein may exhibit improved thermal and mechanical properties as compared to articles made using conventional techniques such as vacuum brazing and electron beam welding. Friction stir welded components may also be more manufacturable in terms of time, cost, and reduced complexity especially for sophisticated substrate components for substrate processing tools.

FSW addresses several limitations of conventional techniques. Such limitations may include weld cracking and porosity resulting in a reduced heat transfer within pedestal or showerhead components and a diminished efficiency of a processing chamber to which such a pedestal or showerhead has been fitted.

Figure 2:
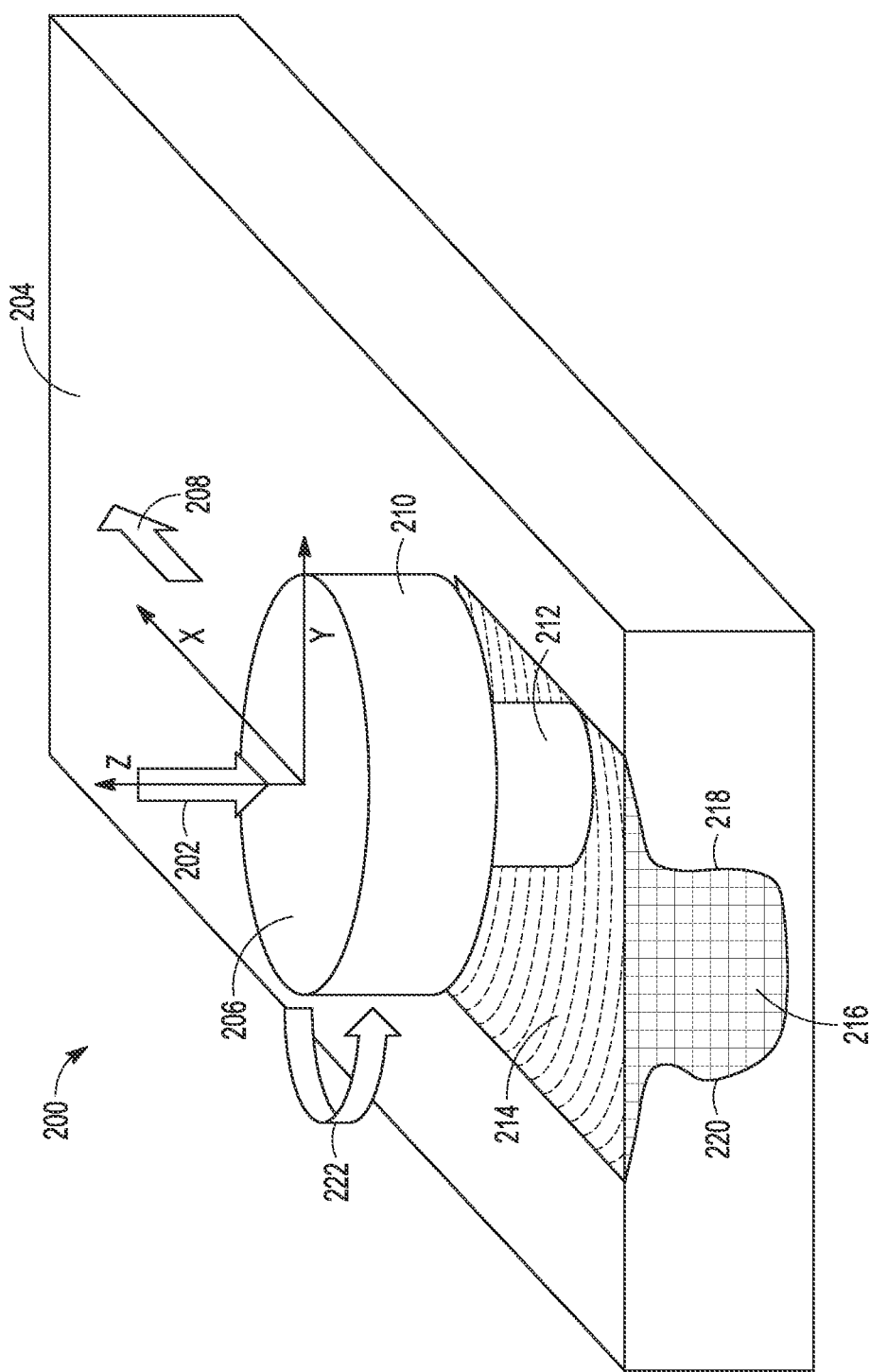
FIG. 2 is a representative diagram illustrating a friction stir welding arrangement in accordance with one embodiment.

With reference to FIG. 2, an arrangement 200 for friction stir welding is provided. A first component 202 of a showerhead 104 or cooling plate 120 may be joined to a second component 204 in the manner shown. The illustrated first component 202 may include an edge portion of a cooling plate 120 (see FIG. 3 below), disposed for example in the processing chamber 102. The illustrated second component 204 may include an edge portion of another component of the showerhead 104, for example a platen disposed in the same zone as the first component 202. As shown, a downward force is exerted on the first component 202 and second component 204 to be joined together by a rotating FSW tool 206. The FSW tool 206 is advanced in a welding direction 208 between the edge portions of the first component 202 and the second component 204. The FSW tool 206 includes a shoulder 210 and a pin 212 and creates an FSW region 214 as the FSW tool 206 advances though the material of the first component 202 and the second component 204 to be joined. The FSW region 214 so formed includes a nugget 216 that joins the first component 202 and the second component 204 together. The nugget 216 has an advancing side 218 and a retreating side 220 corresponding to the rotational direction 222 of the FSW tool 206.

Figure 3:
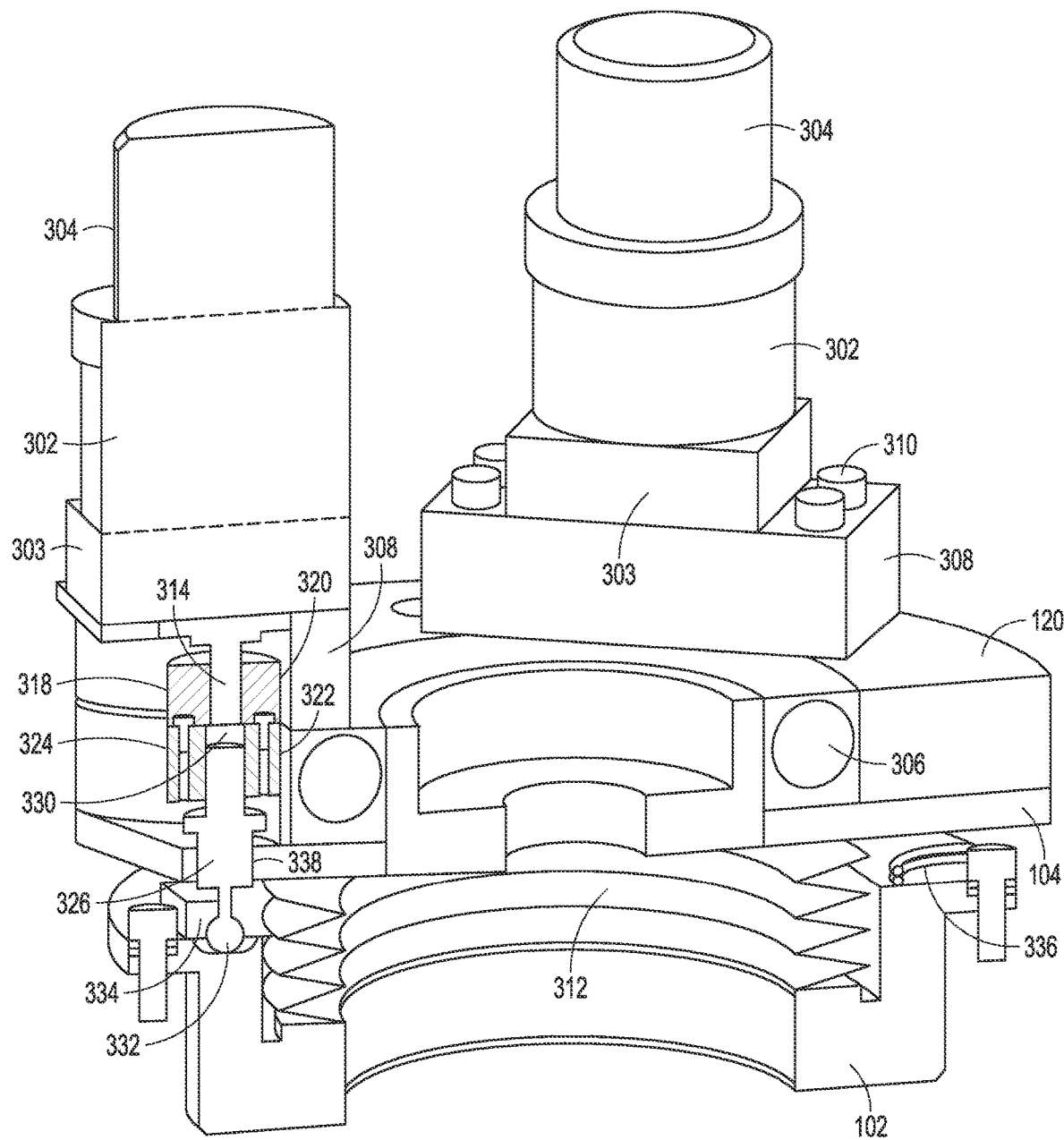
FIG. 3 is a representative diagram illustrating an automated tilting system in accordance with an example embodiment.

FIG. 3 is a part-sectional diagram illustrating an automated tilting system 300 for adjusting an orientation of a showerhead component, such as a showerhead 104 or cooling plate 120 in a processing chamber 102, for example. The orientation may include a planar orientation. In the illustrated example, the cooling plate 120 is connected to a showerhead 104 but other arrangements are possible. In some examples, the cooling plate 120 is a friction stir welded cooling plate 120 or includes friction stir welded components. The cooling plate 120 may include components joined together, or be manufactured at least in part, by an FSW tool 206 in an FSW method described above with reference to FIG. 2. The cooling plate 120 may include one or more channels 306 or conduits for coolant or gas.

As described more fully below, the automated tilting system 300 acts in an automated manner to adjust a planar orientation (or tilt) of the cooling plate 120, and thus the showerhead 104 connected to it, with respect to the processing chamber 102 and the substrate 106 supported within the processing chamber 102. To this end, the automated tilting system 300 includes an arrangement of tilt adjustment motors 302. In the illustrated example, three tilt adjustment motors 302 are provided. Only one motor 302 is fully visible in the view of FIG. 3, a second motor 302 is shown in sectional view, while a third motor is not visible by dint of the line of section. Other numbers and/or configurations of tilt adjustment motors 302 are possible. An automated tilting system 300 comprising three tilt adjustment motors 302 is considered to provide an acceptable degree of tilt fine-tuning capability.

Each of the tilt adjustment motors 302 includes a mounting plate 303 connected to a motor base 308. Each motor base 308 is secured to the cooling plate 120 by one or more fasteners 310. Each of the tilt adjustment motors 302 has a motor shaft 314. Each motor shaft 314 is connected to and held within a coupling 318. The coupling may comprise several parts described in more detail below. In some examples, the motor shaft 314 is splined and held captive in a complementary recess in an upper section 320 of the coupling 318. The splines transmit torque applied from the tilt adjustment motors 302 to the upper section 320 of the coupling 318. Torque is transmitted to a lower section 322 of the coupling 318 by internal keys or connectors 324.

The lower section 322 of the coupling 318 interacts with a screw 326 to provide what is termed an axial plunge coupler-screw interface. In the illustrated example, an upper end 328 of the screw 326 is of box section such that the upper end 328 can receive torque from the lower section 322 of the coupling 318. Further embodiments may include hex or other sections, internal or external coupling arrangements, splines, and tripod joints. The lower section 322 of the coupling 318 includes a complementary box-section recess 330 recess. The box-section recess 330 is deeper than the length of the upper end 328 of the screw 326 and this provides a free "plunge space". The screw 326 can thus receive torque from the tilt adjustment motors 302, yet move axially (i.e., plunge) within the box-section recess 330 in the lower section 322 of the coupling 318. Axially, therefore, the tilt adjustment motors 302 are free of the cooling plate 120 and the showerhead 104 connected to it. The tilt adjustment motors 302 therefore carry no axial load.

An operatively lower end of the screw 326 includes a ball 332. The ball 332 cooperates with a socket clamp 334. The ball-and-socket arrangement imparts a degree of freedom to the automated tilting system 300 such that the cooling plate 120 and showerhead 104 assembly can assume planar orientations that are not necessarily horizontal or orientations that are "tilted" or unaligned with respect to the processing chamber 102 or other datum structure. Other coupling arrangements to this end are possible, for example spherical or other kinds of bearing types or assemblies, such as needle point or jewel bearings. A datum structure may include an external base or supporting component, for example. Other datum structures are possible.

The socket clamp 334 is fixed to the processing chamber 102 and the screw 326 is threaded at thread 338 in the showerhead 104. Thus, selective rotational movement of the screw 326 by the tilt adjustment motors 302 causes the screw 326 to move up or down in an axial or vertical direction relative to the relevant tilt adjustment motors 302, and the showerhead 104, and draw the connected portion of the processing chamber 102 nearer or further away from the showerhead 104. The term "vertical" herein is not necessarily intended to be limited to a strict "geometrically vertical" value (although that value is included within its ambit), but is intended to include examples that are generally vertical or upright.

A planar orientation of the showerhead 104 and cooling plate 120 can be adjusted by controlled action of the tilt adjustment motors 302 working together, Precise degrees of control imparted by the rotary encoder 304 enable the automated tilting system 300 to adjust the orientation of the showerhead 104 and cooling plate 120 in a "fine-tuned" manner. In an example arrangement comprising three tilt adjustment motors 302, the automated tilting system 300 provides automated three-axis tilting capability. Other arrangements that include fewer or more tilt adjustment motors 302 are possible.

The processing chamber 102 includes a bellows 312. The bellows 312 define an extendible and compressible vacuum seal or zone between the processing chamber 102 and the showerhead 104 and can accommodate movement between the processing chamber 102 and the showerhead 104. The bellows 312 allow the showerhead 102 to move without breaking a vacuum seal. In some examples, other seal means may be provided, for example an arrangement including one or more O-rings.

In some examples, the processing chamber 102 is attached to an external base or supporting component by fasteners 316. In these examples, the processing chamber 10 may be said to be fixed (datum structure) in which case an adjusted showerhead 104 or cooling plate 120 would move relative to the processing chamber 102. In other examples, the opposite situation occurs. In the illustrated example, the weight of the showerhead 104 and a loading from a differential pressure (i.e. outside atmosphere versus an inside "vacuum" load) is supported by the three ball-and-socket clamps (i.e. the ball 332 and the socket clamp 334), but is at least partially offset by one or more load compensation springs 336. Other compensation mechanism or arrangements (for example gas springs) are possible. The degree of load compensation may be selected in view of the strength of any vacuum suction inside the bellows 312.

The rotary encoder 304 may include or be controlled by one or more controller 400. In some examples, a controller 400 provides intelligent or "smart" control capability. Intelligent control may include for example tilting between substrate processing steps, more concise and user-friendly tilt adjustment. Some examples include preemptive adjustment of tilt to mitigate the effects of wear of components on process results. Some examples enable tracking of how much tilt would be used over time for any tool, set of tools, design, and so forth. Some examples store previous showerhead tilt settings so when the next showerhead is installed, any offsets that fingerprint the tool can be applied to "estimate" the correct tilt and increase likelihood of first pass success.

Figure 4:
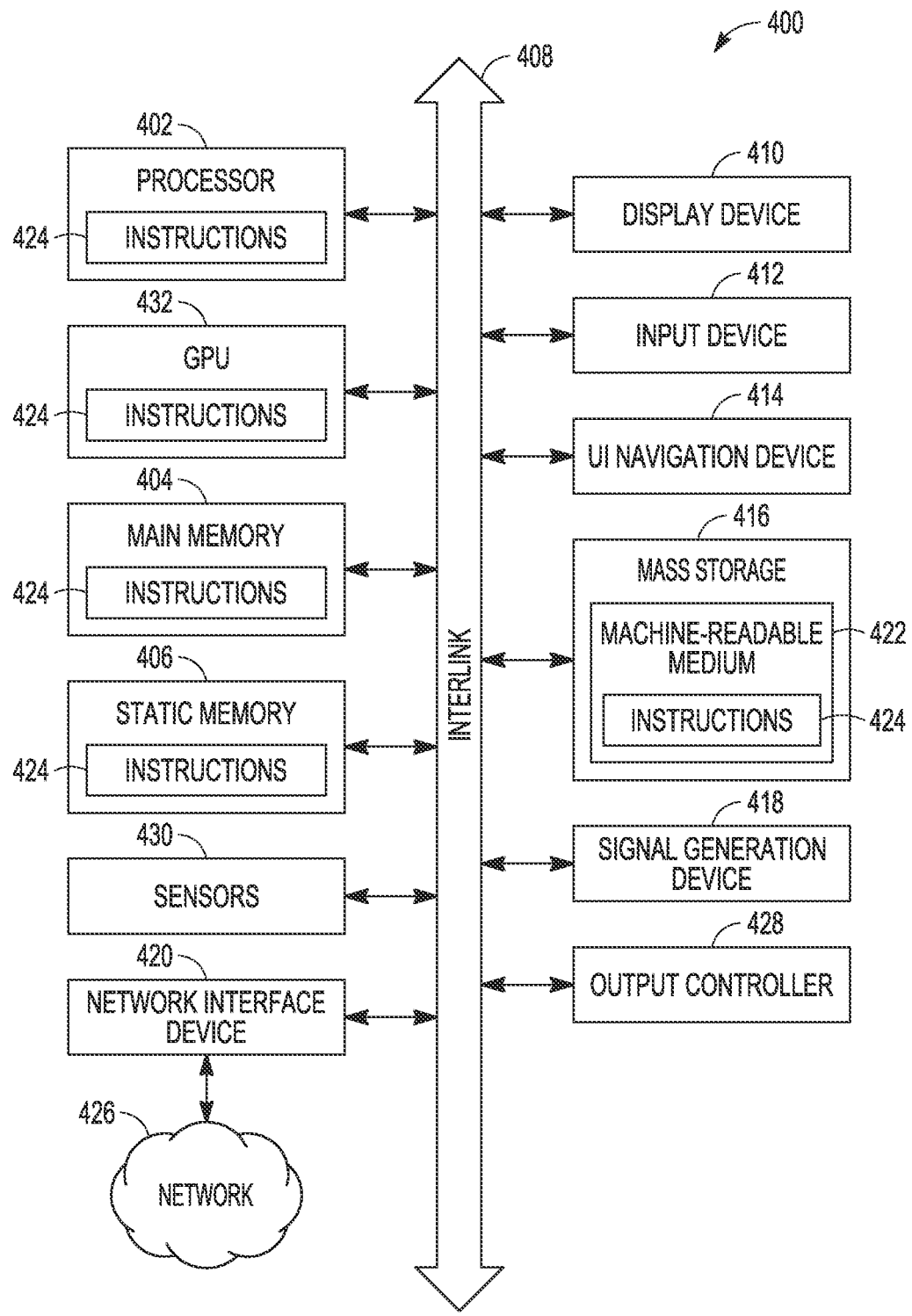
FIG. 4 is a block diagram illustrating an example of a controller upon which one or more example embodiments may be implemented, or by which one or more example embodiments may be controlled.

FIG. 4 is a block diagram illustrating an example controller 400 by which one or more systems or methods described herein may be implemented or controlled. In alternative embodiments, the controller 400 may operate as a standalone device or may be connected (e.g., networked) to other machines. In a networked deployment, the controller 400 may operate in the capacity of a server machine, a client machine, or both in server-client network environments. In an example, the controller 400 may act as a peer machine in a peer-to-peer (P2P) (or other distributed) network environment. Further, while only a single controller 400 is illustrated, the term "machine" (controller) shall also be taken to include any collection of machines (controllers) that individually or jointly execute a set (or multiple sets) of instructions to perform any one or more of the methodologies discussed herein, such as via cloud computing, software as a service (SaaS), or other computer cluster configurations. In some examples, and referring to FIG. 4, a non-transitory machine-readable medium includes instructions 424 that, when read by a controller 400, cause the controller to control operations in methods comprising at least the non-limiting example operations described herein.

Examples, as described herein, may include, or may operate by logic, a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a Computer-Readable Medium physically modified (e.g., magnetically, electrically, by moveable placement of invariant massed particles, etc.) to encode instructions of the specific operation. In connecting the physical components, the underlying electrical properties of a hardware constituent are changed (for example, from an insulator to a conductor or vice versa) The instructions enable embedded hardware (e.g., the execution units or a loading mechanism) to create members of the circuitry in hardware via the variable connections to carry out portions of the specific operation when in operation. Accordingly, the Computer-Readable Medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) controller 400 may include a hardware Processor 402 (e.g., a central processing unit (CPU), a hardware processor core, or any combination thereof), a GPU 432 (graphics processing unit), a main memory 404, and a static memory 406, some or all of which may communicate with each other via an interlink 408 (e.g., a bus) The controller 400 may further include a display device 410, an alphanumeric input device 412 (e.g., a keyboard), and a UI navigation device 414 (e.g., a mouse or other user interface). In an example, the display device 410, alphanumeric input device 812, and UI navigation device 414 may be a touch screen display. The controller 400 may additionally include a mass storage device 416 (e.g., drive unit), a signal generation device 418 (e.g., a speaker), a network interface device 420, and one or more sensors 430, such as a Global Positioning System (GPS) sensor, compass, accelerometer, or another sensor. The controller 400 may include an output controller 428, such as a serial (e.g., universal serial bus (USB)), parallel, or other wired or wireless (e.g., infrared (IR), near field communication (NFC), etc.) connection to communicate with or control one or More peripheral devices (e.g., a printer, card reader, etc.).

The mass storage device 416 may include a machine-readable medium 422 on which is stored one or more sets of data structures or instructions 424 (e.g., software) embodying or utilized by any one or more of the techniques or functions described herein. The instructions 424 may as shown also reside, completely or at least partially, within the main memory 404, within the static memory 406, within the hardware processor 402, or within the GPU 432 during execution thereof by the controller 400. In an example, one or any combination of the hardware processor 402, the GPU 432, the main memory 404, the static memory 406, or the mass storage device 416 may constitute the machine-readable medium 422.

While the machine-readable medium 422 is illustrated as a single medium, the term "machine-readable medium" may include a single medium, or multiple media (e.g., a centralized or distributed database, and/or associated caches and servers) configured to store the one or more instructions 824.

The term "machine-readable medium" may include any medium that can store, encode, or carry instructions 424 for execution by the controller 400 and that cause the controller 400 to perform any one or snore of the techniques of the present disclosure, or that can store, encode, or carry data structures used by or associated with such instructions 424. Non-limiting machine-readable medium examples may include solid-state memories, and optical and magnetic media. In an example, a massed machine-readable medium comprises a machine-readable medium 422 with a plurality of particles having invariant (e.g., rest) mass. Accordingly, massed machine-readable media are not transitory propagating signals. Specific examples of massed machine-readable media may include non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks; and CD-ROM and DVD-ROM disks. The instructions 424 may further be transmitted or received over a communications network 426 using a transmission medium via the network interface device 420.

Figure 5:
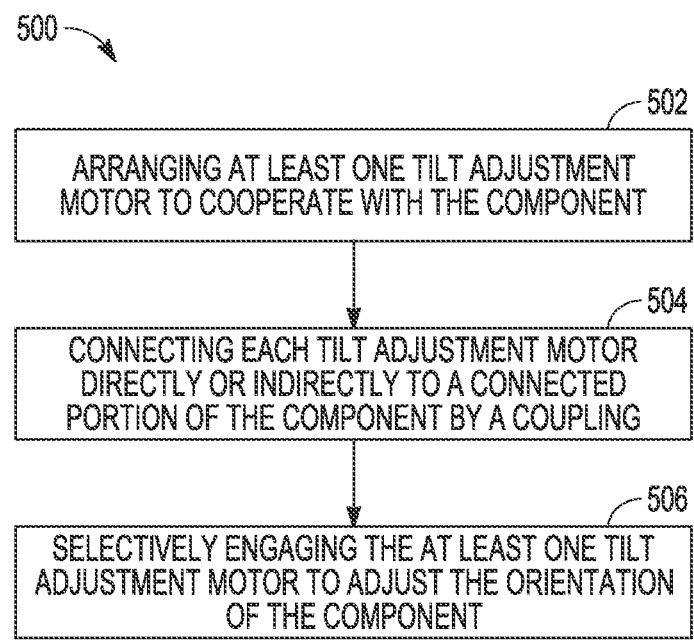
FIG. 5 is a flow chart illustrating a method in accordance with one embodiment.

Some examples herein include methods. With reference to FIG. 5, a method 500 of adjusting an orientation of a component in a substrate processing chamber is provided. The method 500 comprises, at operation 502, arranging at least one tilt adjustment motor to cooperate with the component; at operation 504, connecting each tilt adjustment motor directly or indirectly to a connected portion of the component by a coupling, the coupling configured such that automated rotational motion by the at least one tilt adjustment motor imparts corresponding axial movement, relative to the at least one tilt adjustment motor or a datum structure, to the connected portion of the component thereby to adjust the orientation of the component in the processing chamber; and, at operation 506, selectively engaging the at least one tilt adjustment motor to adjust the orientation of the component.

Although examples have been described with reference to specific example embodiments or methods, it will be evident that various modifications and changes may be made to these embodiments without departing from the broader scope of the embodiments. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This detailed description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. An automated tilting system for adjusting an orientation of a component in a substrate processing chamber, the automated tilting system comprising:
at least one tilt adjustment motor arranged to cooperate with the component;
the at least one tilt adjustment motor connected directly or indirectly to a connected portion of the component by a coupling, the coupling configured such that automated rotational motion by the at least one tilt adjustment motor imparts corresponding axial movement, relative to the at least one tilt adjustment motor or a datum structure, to the connected portion of the component thereby to adjust the orientation of the component in the processing chamber, wherein the coupling comprises:
a plunge interface that allows axial movement of a driven member relative to a drive member while transmitting rotational motion between the drive member and the driven member,
wherein the driven member is configured to move axially independent of the at least one tilt adjustment motor to decouple axial loads from the at least one tilt adjustment motor, and wherein the component is a showerhead component or a cooling plate component.

2. The automated tilting system of claim 1, wherein the coupling includes an axial plunge coupler-screw interface.

3. The automated tilting system of claim 2 wherein the axial plunge coupler-screw interface decouples axial load from an associated tilt adjustment motor.

4. The automated tilting system of claim 2, wherein the axial plunge coupler-screw interface includes a ball-end screw received in a spherical cup.

5. The automated tilting system of claim 1, further comprising a bellows interposed between the component and the processing chamber.

6. The automated tilting system of claim 5, wherein the bellows at least partially provides a vacuum seal between the component and the processing chamber.

7. The automated tilting system of claim 1, further comprising one or more load compensators.

8. The automated tilting system of claim 1, wherein the component includes a friction stir welded component.

\* \* \* \* \*